(12) United States Patent
Byun

(10) Patent No.: US 9,048,713 B2
(45) Date of Patent: Jun. 2, 2015

(54) ELECTRIC POWER STEERING SYSTEM AND METHOD FOR CHECKING INITIAL DRIVING THEREOF

(71) Applicant: MANDO CORPORATION, Pyeongtaek-si, Gyeonggi-do (KR)

(72) Inventor: Tae Wan Byun, Seongnam-si (KR)

(73) Assignee: MANDO CORPORATION, Pyeongtaek-Si, Gyeonggi-Do (KR)

( * ) Notice: Subject to any disclaimer, the term of this patent is extended or adjusted under 35 U.S.C. 154(b) by 86 days.

(21) Appl. No.: 13/904,608

(22) Filed: May 29, 2013

(65) Prior Publication Data

US 2013/0320906 A1      Dec. 5, 2013

(30) Foreign Application Priority Data

May 29, 2012 (KR) .......................... 10-2012-0056793

(51) Int. Cl.
| | |
|---|---|
| G01R 31/02 | (2006.01) |
| H02H 3/04 | (2006.01) |
| H02H 7/08 | (2006.01) |
| H02K 11/00 | (2006.01) |
| B62D 5/04 | (2006.01) |
| G01R 31/42 | (2006.01) |
| G07C 3/00 | (2006.01) |
| G01R 31/34 | (2006.01) |

(52) U.S. Cl.
CPC .............. *H02K 11/001* (2013.01); *G01R 31/42* (2013.01); *G07C 3/00* (2013.01); *G01R 31/343* (2013.01); *B62D 5/0457* (2013.01); *B62D 5/0481* (2013.01)

(58) Field of Classification Search
CPC .... G01R 31/343; G01R 31/34; H02K 11/001; G07C 3/00
USPC ........................................................ 318/490
See application file for complete search history.

(56) References Cited

U.S. PATENT DOCUMENTS

| 6,373,217 B1 * | 4/2002 | Kawada et al. ................ 318/564 |
| 2011/0071730 A1 * | 3/2011 | Nakai .............................. 701/42 |

FOREIGN PATENT DOCUMENTS

JP          11-091605          4/1997

OTHER PUBLICATIONS

Korean Office Action issued on Apr. 21, 2014 (Korean Application No. 10-2012-0056793).

* cited by examiner

*Primary Examiner* — Shawki S Ismail
*Assistant Examiner* — Bradley Brown
(74) *Attorney, Agent, or Firm* — McDermott Will & Emery LLP

(57) ABSTRACT

Provided are an electric power steering system and a method for checking an initial driving thereof, in which no additional redischarging and charging time is required by simultaneously determining a freezing of a safety switch and/or a safety switch off of a sub MCU, which monitors a state of a main MCU, thereby shortening initial driving time of the electric power steering system. The electric power steering system includes: a power supply; a motor configured to generate steering auxiliary power; a safety switch provided between the power supply and the motor and configured to control supply of power; a main MCU configured to control an operation of the safety switch; and a sub MCU configured to monitor a state of the main MCU. The main MCU applies an on driving signal to the safety switch, receives front and rear stage voltages of the safety switch, and determines that the safety switch has been frozen and/or a safety switch off function of the sub MCU has failed, when there is no potential difference between the received front and rear stage voltages.

6 Claims, 3 Drawing Sheets

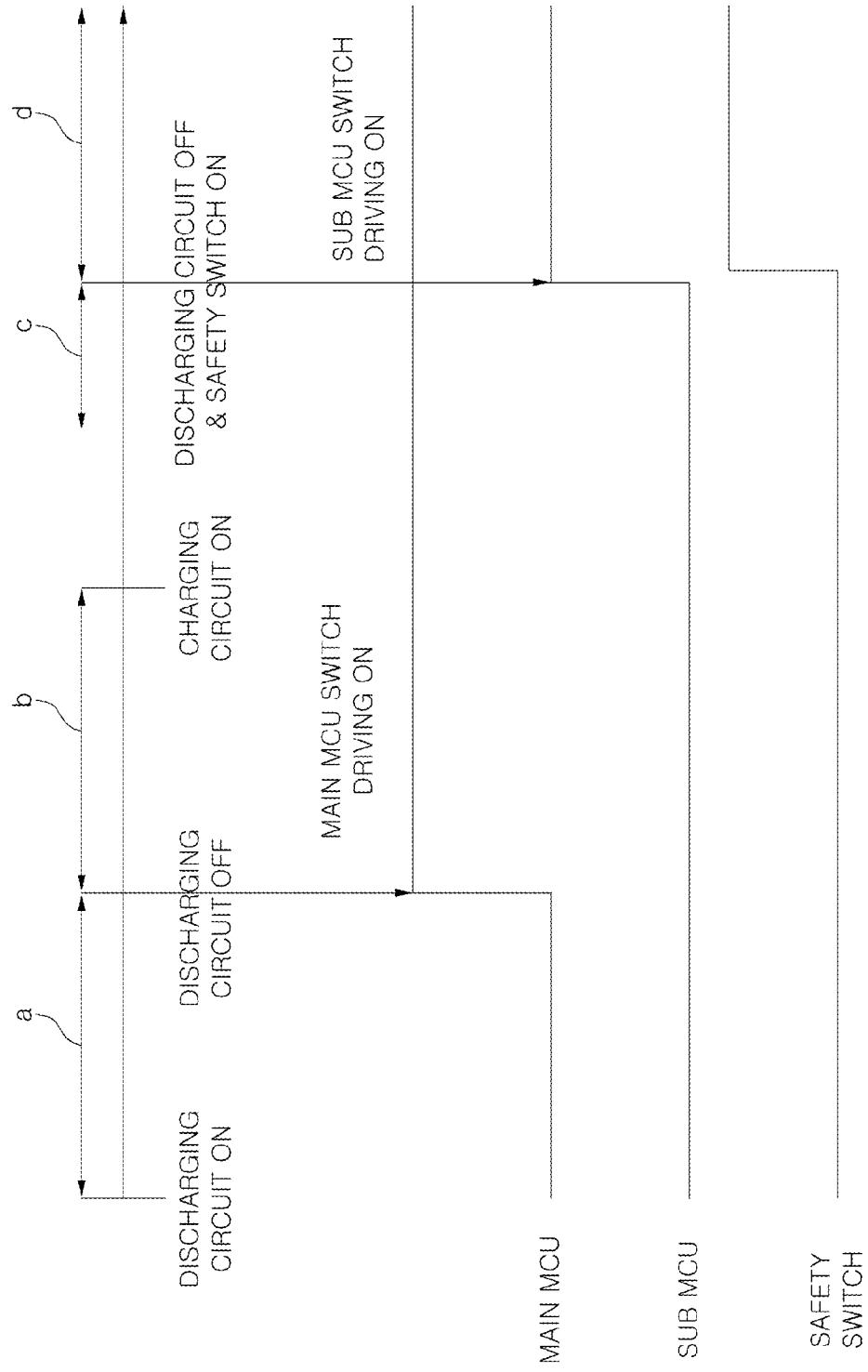

ELECTRIC POWER STEERING SYSTEM AND METHOD FOR CHECKING INITIAL DRIVING THEREOF

CROSS-REFERENCE(S) TO RELATED APPLICATION

This application claims priority of Korean Patent Application No. 10-2012-0056793, filed on May 29, 2012, in the Korean Intellectual Property Office, which is incorporated herein by reference in its entirety.

BACKGROUND OF THE INVENTION

1. Field of the Invention

The present invention relates to an electric power steering system and a method for checking an initial driving thereof, and more particularly, an electric power steering system and a method for checking an initial driving thereof, in which no additional redischarging and charging time is required by simultaneously determining a freezing of a safety switch and/or a safety switch off of a sub MCU, which monitors a state of a main MCU, thereby shortening initial driving time of the electric power steering system.

2. Description of the Related Art

Much research has been conducted on a steering system that can arbitrarily change a driving direction of a vehicle as a driver intends.

As such a steering system, there is a hydraulic power steering (HPS) system using a hydraulic pressure of a hydraulic pump. An electric power steering (EPS) system using an electric motor has been widely used since 1990.

In the HPS system, a hydraulic pump serving as a power source to assist power is driven by an engine and always consumes energy, regardless of rotation of a steering wheel. On the other hand, in the EPS system, when a steering wheel rotates to generate a torque, a motor driven by electric energy supplies steering auxiliary power. Therefore, as compared with the HPS system, the EPS system can improve energy efficiency.

In addition, the EPS system appropriately changes a handle steering force through electronic control according to a driving speed of a vehicle. For example, the EPS system makes the steering force light during parking or low-speed driving, and makes the steering force heavy during high-speed driving, contributing to stability in high-speed driving.

In the conventional EPS system, a main MCU applies an on driving signal to a safety switch so as to check a safety switch off of a sub MCU which monitors a state of the main MCU. Then, when disabling a safety switch driving signal of the sub MCU, additional redischarging and charging time are required after the check. As a result, the initial driving time of the EPS system is lengthened. Accordingly, the conventional EPS system has difficulty in satisfying initial driving requirements required by companies.

In addition, in the conventional EPS system, when the safety switch is switched on to connect a motor and a power supply, a potential difference occurs between front and rear stages of the safety switch. Thus, the durability of the safety switch may be degraded, and peripheral circuits may be burnt by sparks.

SUMMARY OF THE INVENTION

An aspect of the present invention is directed to provide an EPS system and a method for checking an initial driving thereof, in which no additional redischarging and charging time is required by simultaneously determining a freezing of a safety switch and/or a safety switch off of a sub MCU, which monitors a state of a main MCU, thereby shortening initial driving time of the EPS system.

According to an embodiment of the present invention, there is provided an EPS system, including: a power supply; a motor configured to generate steering auxiliary power; a safety switch provided between the power supply and the motor and configured to control supply of power; a main MCU configured to control an operation of the safety switch; and a sub MCU configured to monitor a state of the main MCU, wherein the main MCU applies an on driving signal to the safety switch, receives front and rear stage voltages of the safety switch, and determines that the safety switch has been frozen and/or a safety switch off function of the sub MCU has failed, when there is no potential difference between the received front and rear stage voltages.

The EPS system may further include: a discharging circuit configured to discharge the rear stage voltage of the safety switch; and a charging circuit configured to charge the rear stage voltage of the safety switch, wherein the main MCU determines whether the rear stage voltage of the safety switch, which has been discharged according to the driving of the discharging circuit, has reached a discharging reference voltage, performs control of stopping driving the discharging circuit when the rear stage voltage has reached the discharging reference voltage, determines whether the rear stage voltage, which has been charged according to the driving of the charging circuit, has reached a charging reference voltage, and performs control of stopping driving the charging circuit when the rear stage voltage has reached the charging reference voltage.

When the rear stage voltage of the safety switch has reached the charging reference voltage, the main MCU may provide the sub MCU with an on driving signal for switching on the safety switch, and the safety switch may be connected to a gate operating according to the on driving signal applied from the main MCU and the sub MCU, and may be switched such that the power of the power supply is supplied to the motor.

According to another embodiment of the present invention, there is provided a method for checking an initial driving of an electric power steering system, including a power supply, a motor configured to generate steering auxiliary power, a safety switch provided between the power supply and the motor and configured to control supply of power, a main MCU configured to control an operation of the safety switch, and a sub MCU configured to monitor a state of the main MCU. The method includes: applying, by the main MCU, an on driving signal to the safety switch; receiving, by the main MCU, front and rear stage voltages of the safety switch; and when there is no potential difference between the received front and rear stage voltages, determining, by the main MCU, that the safety switch has been frozen and/or a safety switch off function of the sub MCU has failed.

Before applying the on driving signal to the safety switch, the method may further include: driving, by the main MCU, a discharging circuit to discharge the rear stage voltage of the safety switch; determining, by the main MCU, whether the rear stage voltage having been discharged according to the driving of the discharging circuit has reached a discharging reference voltage; and stopping, by the main MCU, driving the discharging circuit when the rear stage voltage has reached the discharging reference voltage.

After applying the on driving signal to the safety switch, the method may further include: driving, by the main MCU, a charging circuit to charge the rear stage voltage of the safety switch; determining, by the main MCU, whether the rear stage voltage having been charged according to the driving of the charging circuit has reached a charging reference voltage; and stopping, by the main MCU, driving the charging when the rear stage voltage has reached the charging reference voltage.

After stopping driving the charging circuit, the method may further include providing, by the main MCU, a safety switch on driving signal to the sub MCU which monitors the state of the main MCU, and the safety switch may be connected to a gate operating according to the on driving signal applied from the main MCU and the sub MCU, and may be switched such that the power of the power supply is supplied to the motor.

BRIEF DESCRIPTION OF THE DRAWINGS

FIG. 3 is a timing diagram showing on/off states of a main MCU, a sub MCU, and a safety switch.

DETAILED DESCRIPTION OF EXEMPLARY EMBODIMENTS

It is understood that the term "freezing" or "frozen" as used herein means "non-responsive."

Hereinafter, exemplary embodiments of the present invention will be described in detail with reference to the accompanying drawings.

Figure 1:
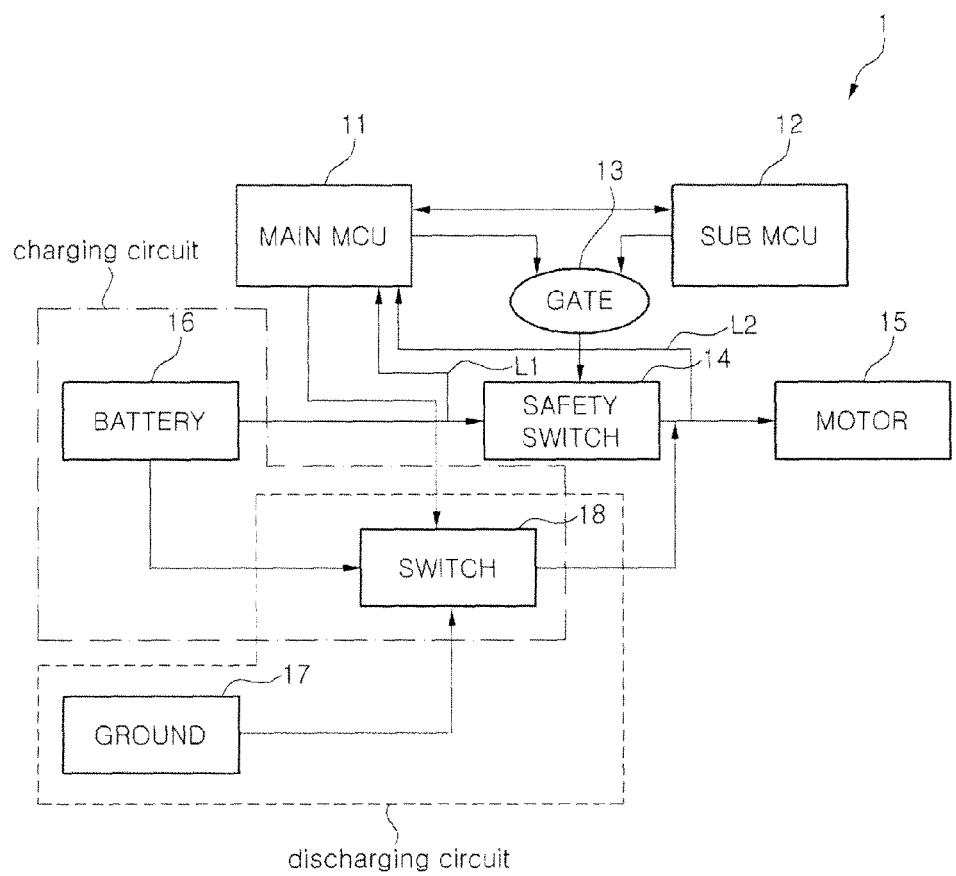
FIG. 1 is a diagram for describing an EPS system according to an embodiment of the present invention.

FIG. 1 is a diagram for describing an EPS system according to an embodiment of the present invention.

Referring to FIG. 1, the EPS system 1 according to the present invention may include a main micro control unit (MCU) 11, a sub MCU 12 configured to monitor a state of the main MCU 11, a motor 15 configured to generate steering auxiliary power, and a safety switch 14 configured to supply/ shut off power of a power supply, that is, a battery 16, to the motor 15.

The main MCU 11 checks a driver's steering intention and a driving state of a vehicle, and controls an operation of the motor 15 by using various logics mounted thereon. The motor 15 generates the steering auxiliary power, based on a control signal output from the main MCU 11.

The main MCU 11 and the sub MCU 12 can perform bidirectional communication.

The sub MCU 12 can monitor the state of the main MCU 11 through communication with the main MCU 11, and notify a state of the sub MCU 12 to the main MCU 11.

When self failure of the main MCU 11 occurs, the sub MCU 12 may detect the self-failure of the main MCU 11 by applying an off driving signal to the safety switch 14 through communication with the main MCU 11.

The safety switch 14 is connected between the main MCU 11 and the sub MCU 12 through a gate 13. The gate 13 is an AND gate.

When an on driving signal, for example, "1", is input from both of the main MCU 11 and the sub MCU 12 to the gate 13, the safety switch 14 is switched on. When an off driving signal, for example, "0", is input from either or both of the main MCU 11 and the sub MCU 12 to the gate, the safety switch 14 is switched off.

The main MCU 11 applies the on driving signal to the safety switch 14 upon initial driving and then receives front and rear stage voltages of the safety switch 14. When there is no potential difference between the front and rear stage voltages of the safety switch 14, the main MCU 11 determines that the safety switch 14 has been frozen or non-responsive and/or a safety switch off function of the sub MCU 12 has failed. In this case, the main MCU 11 is connected to the front stage of the safety switch 14 by a first line L1, and is connected to the rear stage of the safety switch 14 by a second line L2. A converter (not shown) is provided to convert the front and rear stage voltages of an analog form, which are received through the first and second lines L1 and L2, into a digital form.

In particular, the main MCU 11 discharges the rear stage voltage of the safety switch 14 by driving a discharging circuit configured with a ground 17, a switch 18, and the like. When the rear stage voltage of the safety switch 14 is received and reaches a discharging reference voltage, the main MCU 11 stops driving the discharging circuit by switching off the switch 18 connecting the ground 17 and the rear stage of the safety switch 14. Therefore, the freezing of the safety switch 14 can be accurately checked.

In addition, after discharging the rear stage voltage of the safety switch 14 and simultaneously determining the freezing of the safety switch 14 and/or the safety switch off of the sub MCU 12, the main MCU 11 charges the rear stage voltage of the safety switch 14 by driving a charging circuit, thereby further shortening initial driving time as compared with the conventional EPS system having required additional redischarging and charging time.

Specifically, the main MCU 11 charges the rear stage voltage of the safety switch 14 by driving a charging circuit (not shown) configured with a battery 16, a switch 18, and the like. When the rear stage voltage of the safety switch 14 is received and reaches a charging reference voltage, the main MCU 11 stops driving the charging circuit by switching off the switch 18 connecting the battery 16 and the rear stage of the safety switch 14. Therefore, when the on driving signals are input from both of the main MCU 11 and the sub MCU 12, the potential difference between the front and rear stage voltages of the safety switch 14 can be reduced.

On the other hand, the main MCU 11 switches on the switch 18 connecting the battery 16 and the rear stage of the safety switch 14 upon driving the charging circuit, and switches off the corresponding switch 18 when the rear stage voltage of the safety switch 14 has reached the charging reference voltage. In addition, the main MCU 11 switches on the switch 18 connecting the ground 17 and the rear stage of the safety switch 14 upon driving the discharging circuit, and switches off the corresponding switch 18 when the rear stage voltage of the safety switch 14 has reached the discharging reference voltage. In this case, the charging rate and the discharging rate of the charging circuit and the discharging circuit are determined by time constant in circuit design.

A method for checking an initial driving of the EPS system having the above configuration will be described.

Figure 2:
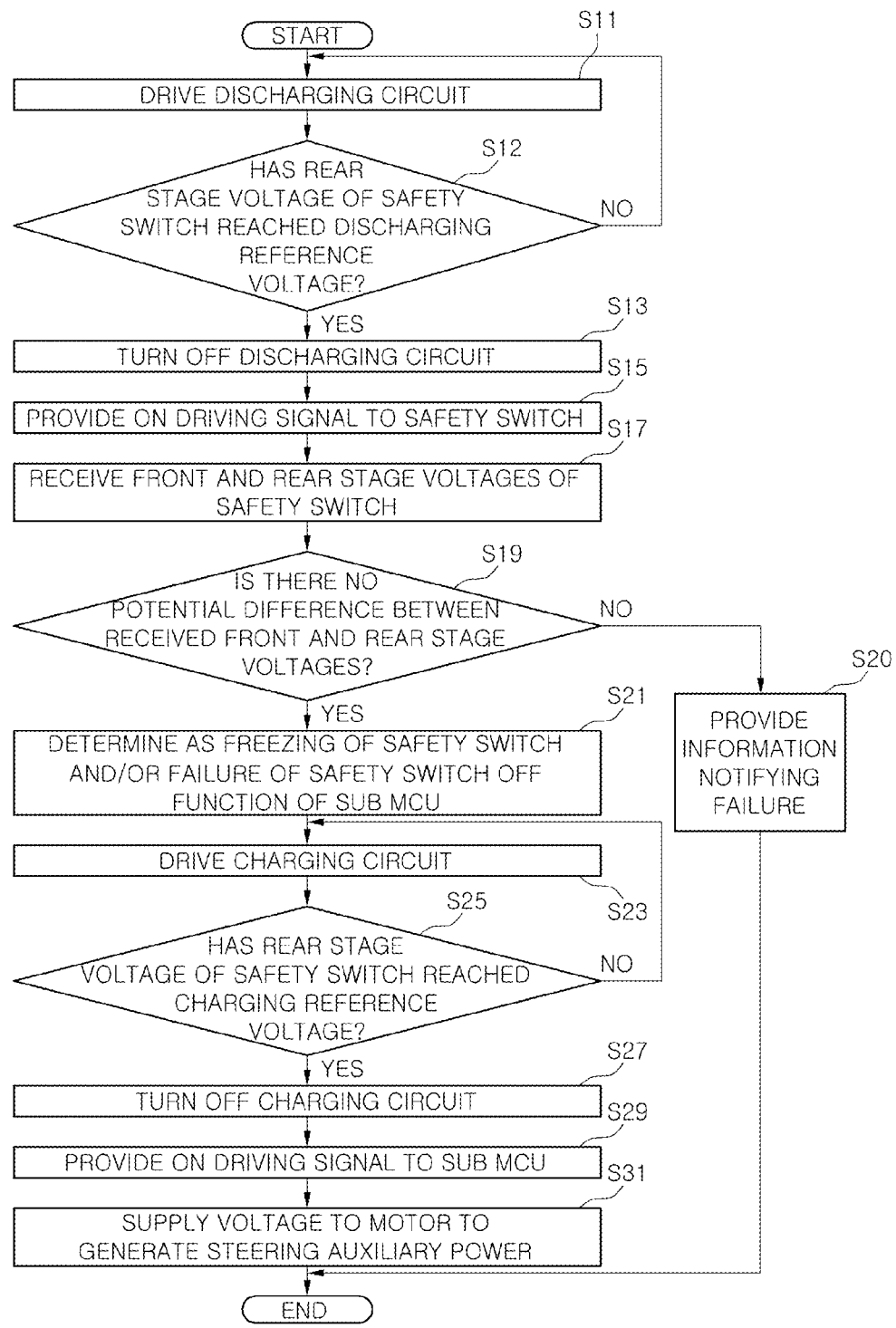
FIG. 2 is an operation flow diagram for describing a method for checking an initial driving of an EPS system according to an embodiment of the present invention.

FIG. 2 is an operation flow diagram for describing a method for checking an initial driving of the EPS system according to an embodiment of the present invention, and FIG. 3 is a timing diagram showing the on/off states of the main MCU, the sub MCU, and the safety switch.

Referring to FIGS. 2 and 3, the main MCU 11 drives the discharging circuit upon initial driving by switching on the switch 18 between the ground 17 and the safety switch 14 (S11). Therefore, the main MCU 11 discharges the rear stage voltage of the safety switch 14 according to the driving of the discharging circuit.

Then, the main MCU 11 receives the rear stage voltage of the safety switch 14 and determines whether the received rear stage voltage has reached the discharging reference voltage, for example, 0 V (S12).

When it is determined in step S12 that the rear stage voltage has not reached the discharging reference voltage, the process returns to step S11 to drive the discharging circuit.

When it is determined in step S12 that the rear stage voltage has reached the discharging reference voltage, the main MCU 11 turns off the discharging circuit by switching off the switch 18 between the ground 17 and the safety switch 14 (S13).

Then, the main MCU 11 provides an on driving signal to the safety switch 14 (S15).

Then, the main MCU 11 receives the front and rear stage voltages of the safety switch 14 (S17).

Then, the main MCU 11 determines whether there is no potential difference between the front and rear stage voltages of the safety switch 14 (S19).

When it is determined in step S19 that there is the potential difference between the front and rear stage voltages of the safety switch 14, the main MCU 11 provides information notifying the failure of at least one of the main MCU 11, the sub MCU 12, and the safety switch 14 (S20).

When it is determined in step S19 that there is no potential difference between the front and rear stage voltages of the safety switch 14, the main MCU 11 determines that the safety switch 14 has been frozen and/or the safety switch off function of the sub MCU 12 has failed (S21).

Then, the main MCU 11 drives the charging circuit by switching on the switch 18 connecting the battery 16 and the rear stage of the safety switch 14 (S23).

Then, the main MCU 11 receives the rear stage voltage of the safety switch 14 according to the driving of the charging circuit, and determines whether the received rear stage voltage has reached the charging reference voltage, for example, 13V (S25).

When it is determined in step S25 that the rear stage voltage of the safety switch 14 has not reached the charging reference voltage, the process returns to step S23 to drive the charging circuit. However, when the rear stage voltage has not reach the charging reference voltage during a predetermined period of time, the main MCU 11 may provide information notifying the failure of the charging circuit.

When it is determined in step S25 that the rear stage voltage of the safety switch 14 has reached the charging reference voltage, the main MCU 11 stop driving the charging circuit by switching off the switch 18 connecting the battery 16 and the rear stage of the safety switch 14 (S27).

Then, the main MCU 11 provides a safety switch on driving signal to the sub MCU 12 (S29).

Then, when the on driving signal is provided to the gate 13 and thus the voltage supplied from the battery 16 is applied to the motor 15, the main MCU 11 performs control such that the steering auxiliary power is generated according to the driver's steering degree (S31)

Referring to the timing diagram of FIG. 3, first, the main MCU 11 drives the discharging circuit. Reference symbol "a" of FIG. 3 represents a discharging period, and it can be seen that the main MCU 11, the sub MCU 12, and the safety switch 14 are all in an off state.

When the rear stage voltage of the safety switch 14 has reached the discharging reference voltage according to the driving of the discharging circuit, the main MCU 11 turns off the discharging circuit and simultaneously applies the safety switch on driving signal to the gate 13. After applying the safety switch on driving signal, the main MCU 11 receives the front and rear stage voltages of the safety switch 14 and determines whether there is no potential difference between the front and rear stage voltages. When there is no potential difference, the main MCU 11 determines that the safety switch 14 has been frozen and/or the safety switch off function of the sub MCU 12 has failed. Reference symbol "b" of FIG. 3 represents a period of determining as the freezing of the safety switch 14 and/or the failure of the safety switch off function of the sub MCU 12, and it can be seen that the main MCU 11 is in an on state, and the sub MCU 12 and the safety switch 14 is in an off state.

When determining as the freezing of the safety switch 14 and/or the failure of the safety switch off function of the sub MCU 12, the main MCU 11 drives the charging circuit. Then, the main MCU 11 can check the failure of the charging circuit by determining whether the rear stage voltage of the safety switch 14 has reached the charging reference voltage according to the driving of the charging circuit. Reference symbol "c" of FIG. 3 represents a period during which the failure of the charging circuit can be checked. When the rear stage voltage has not reached the charging reference voltage even though the rear stage voltage of the safety switch 14 has been charged during a predetermined period of time, it may be determined that the charging circuit has failed.

Then, when the rear stage voltage of the safety switch 14 has reached the charging reference voltage according to the driving of the charging circuit, the main MCU 11 turns off the charging circuit and simultaneously switches on the safety switch of the sub MCU 12, so that the steering control of the EPS system can be started. Reference symbol "d" of FIG. 3 represents a steering control period of the EPS system, and it can be seen that the main MCU 11, the sub MCU 12, and the safety switch 14 are all in an on state.

In this manner, no additional redischarging and charging time is required. Thus, as compared with the conventional EPS system, the initial driving time can be shortened, and the potential difference between the front and rear stage voltages of the safety switch 14 can be reduced by charging the rear stage voltage of the safety switch 14.

According to the present invention, no additional redischarging and charging time is required by simultaneously determining the freezing of the safety switch and/or the safety switch off of the sub MCU, which monitors the state of the main MCU, thereby shortening the initial driving time of the EPS system.

In addition, according to the present invention, the potential difference between the front and rear stage voltages of the safety switch can be reduced by configuring the charging circuit to charge the rear stage voltage of the safety switch. Therefore, it is possible to improve the durability of the safety switch and prevent the occurrence of sparks through current prevention during input.

Moreover, according to the present invention, the freezing of the safety switch can be accurately checked by configuring the discharging circuit to discharge the rear stage voltage of the safety switch.

While the embodiments of the present invention have been described with reference to the specific embodiments, it will be apparent to those skilled in the art that various changes and modifications may be made without departing from the spirit and scope of the invention as defined in the following claims.

Reference Signs List

| | |
|---|---|
| 1: EPS system | 11: main MCU |
| 12: sub MCU | 13: gate |
| 14: safety switch | 15: motor |

-continued

Reference Signs List

16: battery  17: ground
18: switch

What is claimed is:

1. An electric power steering system, comprising:
 a power supply;
 a motor configured to generate steering auxiliary power;
 a safety switch provided between the power supply and the motor and configured to control supply of power;
 a main micro control unit (MCU) configured to control an operation of the safety switch; and
 a sub MCU configured to monitor a state of the main MCU,
 wherein the main MCU applies an on driving signal to the safety switch, receives front and rear stage voltages of the safety switch, and determines that the safety switch has been frozen and/or a safety switch off function of the sub MCU has failed, when there is no potential difference between the received front and rear stage voltages, and
 when the rear stage voltage of the safety switch has reached a charging reference voltage, the main MCU provides the sub MCU with an on driving signal for switching on the safety switch.

2. The electric power steering system according to claim 1, further comprising:
 a discharging circuit configured to discharge the rear stage voltage of the safety switch; and
 a charging circuit configured to charge the rear stage voltage of the safety switch,
 wherein the main MCU determines whether the rear stage voltage of the safety switch, which has been discharged according to the driving of the discharging circuit, has reached a discharging reference voltage, performs control of stopping driving the discharging circuit when the rear stage voltage has reached the discharging reference voltage, determines whether the rear stage voltage, which has been charged according to the driving of the charging circuit, has reached the charging reference voltage, and performs control of stopping driving the charging circuit when the rear stage voltage has reached the charging reference voltage.

3. The electric power steering system according to claim 1, wherein
 the safety switch is connected to a gate operating according to the on driving signal applied from the main MCU and the sub MCU, and is switched such that the power of the power supply is supplied to the motor.

4. A method for checking an initial driving of an electric power steering system, including a power supply, a motor configured to generate steering auxiliary power, a safety switch provided between the power supply and the motor and configured to control supply of power, a main micro control unit (MCU) configured to control an operation of the safety switch, and a sub MCU configured to monitor a state of the main MCU, the method comprising:
 driving, by the main MCU, a discharging circuit to discharge a rear stage voltage of the safety switch;
 determining, by the main MCU, whether the rear stage voltage having been discharged according to the driving of the discharging circuit has reached a discharging reference voltage;
 stopping, by the main MCU, driving the discharging circuit when the rear stage voltage has reached the discharging reference voltage;
 applying, by the main MCU, an on driving signal to the safety switch;
 receiving, by the main MCU, a front voltage and the rear stage voltage of the safety switch; and
 when there is no potential difference between the received front and rear stage voltages, determining, by the main MCU, that the safety switch has been frozen and/or a safety switch off function of the sub MCU has failed.

5. The method according to claim 4, further comprising, after applying the on driving signal to the safety switch:
 driving, by the main MCU, a charging circuit to charge the rear stage voltage of the safety switch:
 determining, by the main MCU, whether the rear stage voltage having been charged according to the driving of the charging circuit has reached a charging reference voltage; and
 stopping, by the main MCU, driving the charging when the rear stage voltage has reached the charging reference voltage.

6. The method according to claim 5, further comprising, after stopping driving the charging circuit:
 providing, by the main MCU, a safety switch on driving signal to the sub MCU which monitors the state of the main MCU,
 wherein the safety switch is connected to a gate operating according to the on driving signal applied from the main MCU and the sub MCU, and is switched such that the power of the power supply is supplied to the motor.

* * * * *